(12) United States Patent
Chou et al.

(10) Patent No.: US 9,885,125 B2
(45) Date of Patent: Feb. 6, 2018

(54) METHOD FOR MANUFACTURING ISOLATING LAYER ONTO CRUCIBLE AND SPRAYING DEVICE RELATED THERETO

(71) Applicant: SINO-AMERICAN SILICON PRODUCTS INC., Hsinchu (TW)

(72) Inventors: Hung-Sheng Chou, Hsinchu (TW); Li Wei Li, Hsinchu (TW); Wen-Huai Yu, Hsinchu (TW); Bruce Hsu, Hsinchu (TW); Chun-I Fan, Hsinchu (TW); Wen Ching Hsu, Hsinchu (TW)

(73) Assignee: Sino-American Silicon Products Inc., Hsinchu (TW)

( * ) Notice: Subject to any disclaimer, the term of this patent is extended or adjusted under 35 U.S.C. 154(b) by 92 days.

(21) Appl. No.: 14/645,483

(22) Filed: Mar. 12, 2015

(65) Prior Publication Data

US 2015/0259820 A1    Sep. 17, 2015

(30) Foreign Application Priority Data

Mar. 12, 2014    (TW) .............................. 103108664 A (51) Int. Cl.
*B05D 7/22* (2006.01)
*C30B 29/06* (2006.01)
(Continued)

(52) U.S. Cl.
CPC .............. *C30B 29/06* (2013.01); *B05D 7/227* (2013.01); *C30B 35/002* (2013.01); *B05B 12/004* (2013.01); *B05D 1/02* (2013.01)

(58) Field of Classification Search
CPC ..... C30B 29/06; C30B 35/002; B05B 12/004; B05D 1/02; B05D 7/22; B05D 7/227
(Continued)

(56) References Cited

U.S. PATENT DOCUMENTS 7,553,070 B2 * 6/2009 Kollgaard .............. G01N 25/72
                                                         250/341.1
2002/0146510 A1 * 10/2002 Costantini ............... B29C 33/58
                                                         427/226
(Continued)

FOREIGN PATENT DOCUMENTS

| JP | 2012246166 A | 12/2012 |
| JP | 2013544745 A | 12/2013 |
| TW | 201249759 A1 | 12/2012 |

*Primary Examiner* — Kirsten Jolley
(74) *Attorney, Agent, or Firm* — Osha Liang LLP (57) ABSTRACT

A method for manufacturing an isolating layer onto a crucible includes the steps as follows: providing a spraying device for the following spraying steps; heating the crucible and measuring the heated crucible to get a first temperature; spraying a slurry on the inner wall of the crucible to form an isolating layer by a spraying unit with a predetermined spraying manner; measuring the isolating layer to get a second temperature; obtaining a value for the difference between the first and second temperatures and judging whether the difference value in a within predetermined difference scope or not, in which the predetermined difference scope is about 6° C.~12° C.; when the difference value is not in the predetermined difference scope, adjusting the predetermined spraying manner; when the difference value is in the predetermined difference scope, implementing the above spraying steps to the crucible.

7 Claims, 5 Drawing Sheets

(51) Int. Cl.
*C30B 35/00* (2006.01)
*B05B 12/00* (2006.01)
*B05D 1/02* (2006.01)

(58) Field of Classification Search
USPC .......................................................... 427/236
See application file for complete search history.

(56) References Cited

U.S. PATENT DOCUMENTS

2006/0124853 A1* 6/2006 Witthoft ................. G01N 25/72
250/340
2012/0167623 A1* 7/2012 Sudo ..................... C03B 19/095
65/17.3
2013/0026469 A1 1/2013 Phillips et al.
2016/0298227 A1* 10/2016 Zhang .................... C23C 14/26

* cited by examiner

METHOD FOR MANUFACTURING ISOLATING LAYER ONTO CRUCIBLE AND SPRAYING DEVICE RELATED THERETO

BACKGROUND OF THE INVENTION

1. Field of the Invention

The instant invention relates to a method for manufacturing an isolating layer; in particular, to a method for manufacturing an isolating layer onto a crucible and a spraying device related thereto.

2. Description of Related Art

Nowadays, silicon ingots for the semiconductor or solar industry are manufactured using a necessary element, the crucible. The conventional crucible is made of quartz, but quartz will react with molten silicon to cause the molten silicon to adhere on an inner wall of the crucible, thus causing damage to the crucible. Accordingly, the inner wall of crucible needs to be coated with a silicon nitride layer to form an isolating layer, thereby extending the life of the crucible and ensuring the molten silicon within the crucible can be formed into silicon ingots with good quality. However, when forming an isolating layer on the crucible, thickness and uniformity of the isolating layer cannot be determined. Specifically, in a conventional method for manufacturing an isolating layer, the isolating layer formed on the inner wall of crucible cannot be manufactured to a desired thickness and uniformity, such that a crack easily occurs on the isolating layer resulting in reduction of the quality of the silicon ingots.

Moreover, in the polycrystalline-growth process of the solar industry, an isolating layer is prepared with high-purity for preventing molten silicon from directly contacting with a crucible, and the isolating layer is used as a release agent. When the isolating layer is not uniform enough or the isolating layer has a crack, the molten silicon may directly contact and adhere on the crucible. Specifically, the material of a polycrystalline crucible ($SiO_2$) has a thermal expansion characteristic different from the silicon, so the silicon adhered on the crucible may increase a residual stress of the silicon ingots and may decrease yield of the silicon ingots in the cooling or processing processes. Furthermore, when the molten silicon directly contacts the crucible, impurity adhered on the inner wall of the crucible may diffuse into the molten silicon, thus reducing the quality of silicon ingots.

Therefore, how to provide an innovative method for manufacturing an isolating layer onto a crucible has become an important goal, in which the method needs to ensure quality and life of the crucible, good quality of the silicon ingots, and yield of the silicon ingots, thereby solving the conventional problems and reducing cost. Moreover, Taiwan patent No. 201033771 discloses a method for manufacturing an isolating layer, but this method needs to measure the inner wall of a crucible in a complicated way and needs to spray with high accuracy. However, the inner wall of each crucible is different and non-smooth, so the method disclosed in the above patent must gradually measure the inner walls of crucibles, which is obviously time-consuming. Accordingly, the method disclosed in the above patent needs to be improved.

To achieve the abovementioned improvement, the inventors strive via industrial experience and academic research to present the instant disclosure, which can provide additional improvement as mentioned above.

SUMMARY OF THE INVENTION

The instant disclosure provides a method for manufacturing an isolating layer onto a crucible and a spraying device related thereto, which can control the isolating layer by temperature sensing.

The instant disclosure provides a method for manufacturing an isolating layer onto a crucible, comprising: a preparing step: providing a spraying device, wherein the spraying device has a processing unit, a temperature sensing unit electrically connected to the processing unit, and a spraying unit electrically connected to the processing unit; and a plurality of spraying steps, comprising: A) disposing a crucible at a predetermined position; B) heating the crucible, and then measuring an inner wall of the crucible to get a first temperature by the temperature sensing unit; C) spraying a slurry onto the inner wall of the crucible to form an isolating layer by the spraying unit via a predetermined spraying manner; D) measuring the isolating layer formed on the inner wall of the crucible to get a second temperature by the temperature sensing unit; and E) obtaining a difference value based on the first and second temperatures by the processing unit, and judging whether the difference value is in a predetermined difference scope or not by the processing unit, wherein the predetermined difference scope is about 6° C.~12° C.; when the difference value is not in the predetermined difference scope, the processing unit transmits a signal to the spraying unit for adjusting the predetermined spraying manner; when the difference value is in the predetermined difference scope, the spraying steps C)~E) are implemented to the crucible until a plurality of isolating layers stacked on the inner wall of the crucible having a predetermined thickness.

Preferably, the inner wall of the crucible has a side surface and a bottom surface connected to one end of the side surface, another end of the side surface defines an opening, and wherein the side surface defines at least one temperature sensing point, the first and second temperatures are gotten respectively by measuring the at least one temperature sensing point.

The instant disclosure also provides a spraying device for the above method, wherein the processing unit has a computer for setting the temperature sensing point and the predetermined spraying manner; the temperature sensing unit has a first robot manipulator and a temperature sensor installed on the first robot manipulator, the first robot manipulator and the temperature sensor are electrically connected to the computer for being driven by the computer; wherein the first robot manipulator is configured to move the temperature sensor toward the temperature sensing point of the crucible, the temperature sensor is configured to sense a temperature of the crucible and to transmit the temperature to the computer; the spraying unit has a second robot manipulator and a spraying gun installed on the second robot manipulator, the second robot manipulator and the spraying gun are electrically connected to the computer for being driven by the computer; wherein the second robot manipulator is configured to move the spraying gun according to the predetermined spraying manner, and the spraying gun is configured to spray the slurry onto the inner wall of the crucible according to the predetermined spraying manner.

In summary, the method and the spraying device of the instant disclosure are provided to get a difference value by measuring the temperature of the crucible before and after spraying the slurry, such that the processing unit can judge whether the predetermined spraying manner is in normal or abnormal mode by comparing the difference value and the predetermined difference scope, thereby enabling adjusting the predetermined spraying manner immediately.

In order to further appreciate the characteristics and technical contents of the instant invention, references are hereunder made to the detailed descriptions and appended drawings in connection with the instant invention. However, the appended drawings are merely shown for exemplary purposes, rather than being used to restrict the scope of the instant invention.

DETAILED DESCRIPTION OF THE PREFERRED EMBODIMENTS

Figure 1:
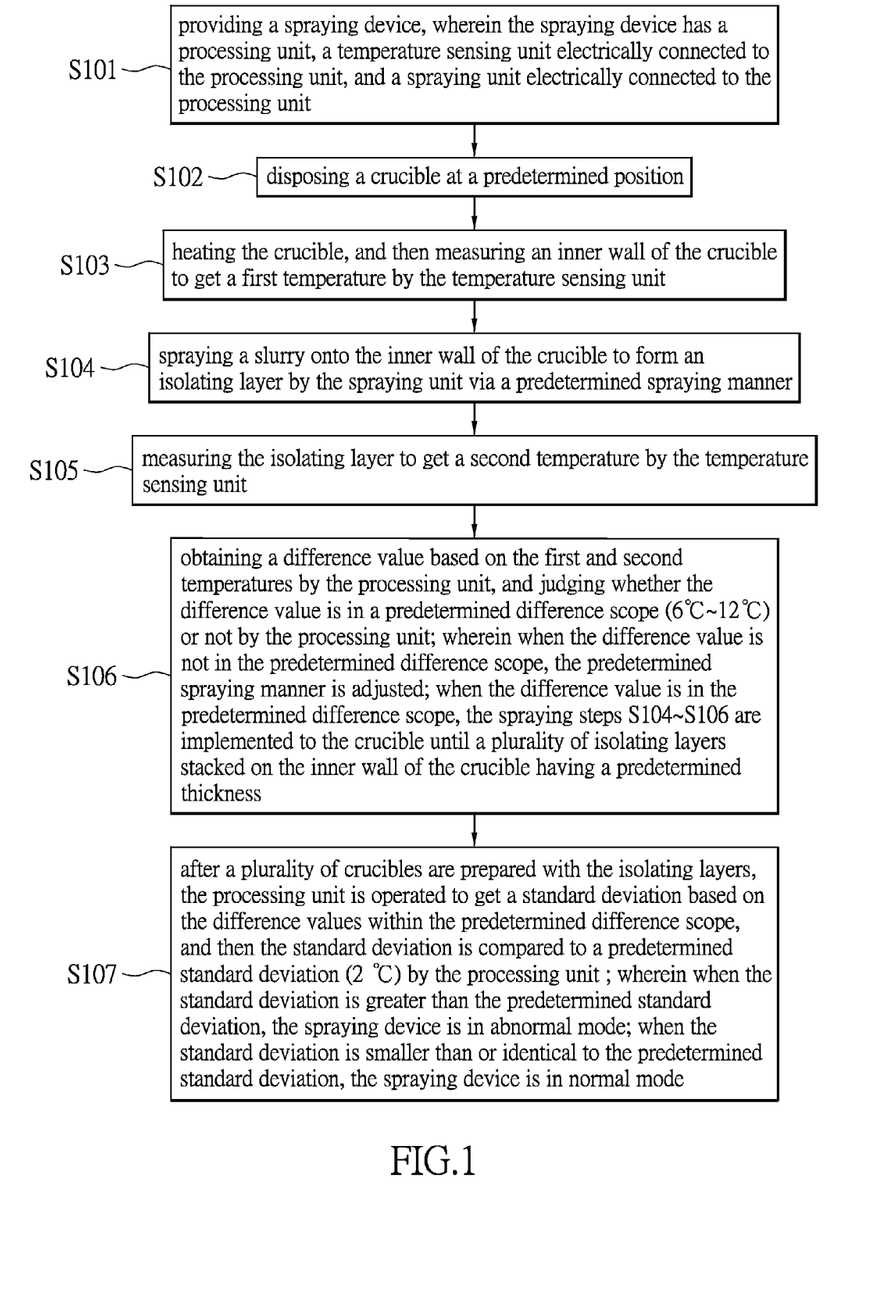
FIG. 1 is a perspective view showing a step chart of a method according to the instant disclosure.
Figure 2:
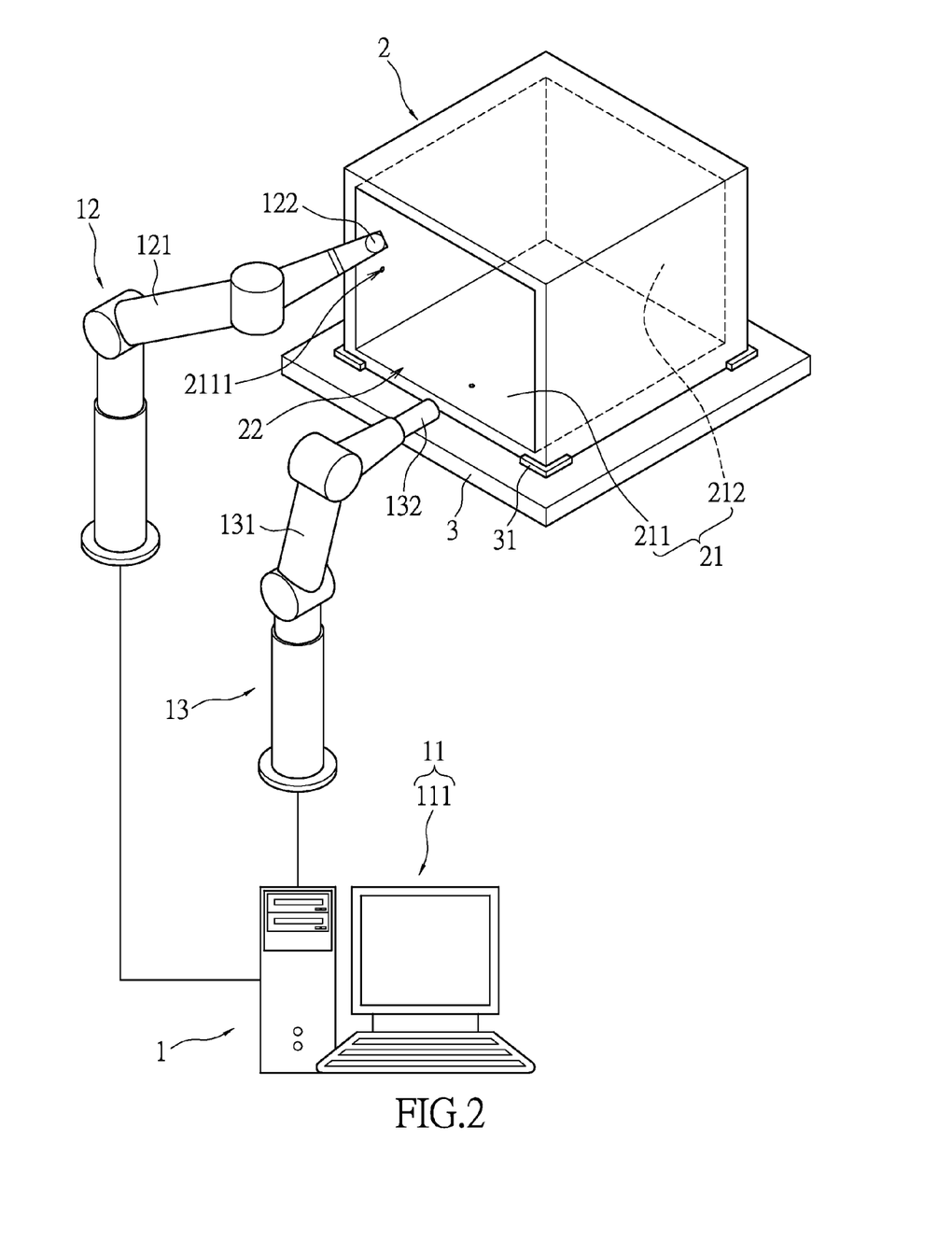
FIG. 2 is a perspective view showing the method of the instant disclosure.

Please refer to FIGS. 1 through 4, which show an embodiment of the instant disclosure. References are hereunder made to the detailed descriptions and appended drawings in connection with the instant invention. However, the appended drawings are merely shown for exemplary purposes, rather than being used to restrict the scope of the instant invention. The instant disclosure provides a method for manufacturing an isolating layer onto a crucible, and the method includes a preparing step (S101), a plurality of spraying steps A~E (S102~S106), and a regulating step (S107). The above steps are disclosed as follows:

Step S101: a spraying device 1 is provided for the following spraying steps (S102~S106). The spraying device 1 has a processing unit 11, a temperature sensing unit 12 electrically connected to the processing unit 11, and a spraying unit 13 electrically connected to the processing unit 11.

Specifically, the processing unit 11 can have a computer 111 for setting a temperature sensing point 2111 at an inner wall 21 of a crucible 2 (further description in Step S103) and a predetermined spraying manner for the spraying unit 13. The predetermined spraying manner has a plurality of adjustable parameters, such as: a predetermined path of a spraying gun 132, a predetermined speed of the spraying gun 132, a sprayed amount of the slurry in per unit time of the spraying gun 132, a spraying force of the slurry of the spraying gun 132, and a spraying distance of the slurry of the spraying gun 132.

Moreover, a predetermined range of each adjustable parameter is preferably set as follows: the sprayed amount of the slurry in per unit time of the spraying gun 132 is approximately 25~60 ml/s, the spraying force of the slurry of the spraying gun 132 is approximately 50~90 lb/in$^2$, and the spraying distance of the slurry of the spraying gun 132 is approximately 15~45 cm, but the adjustable parameters are not limited thereto.

The temperature sensing unit 12 can have a first robot manipulator 121 and a temperature sensor 122 installed on the first robot manipulator 121. The first robot manipulator 121 and the temperature sensor 122 are electrically connected to the computer 111 for being driven by the computer 111. Thus, the first robot manipulator 121 is configured to move the temperature sensor 122 toward the temperature sensing point 2111 of the crucible 2 by the computer 111, and the temperature sensor 122 is configured to sense a temperature of the crucible 2 and to transmit the temperature to the computer 111.

The spraying unit 13 can have a second robot manipulator 131 and a spraying gun 132 installed on the second robot manipulator 131. The second robot manipulator 131 and the spraying gun 132 are electrically connected to the computer 111 for being driven by the computer 111. Thus, the second robot manipulator 131 is configured to move the spraying gun 132 according to the predetermined spraying manner (e.g., the predetermined path and speed) by the computer 111, and the spraying gun 132 is configured to spray the slurry onto the inner wall 21 of the crucible 2 according to the predetermined spraying manner (e.g., the sprayed amount of the slurry in per unit time, the spraying force of the slurry, and the spraying distance of the slurry). The slurry in the instant embodiment is a mixture of silicon nitride (such as silicon nitride plus pure water).

Moreover, the temperature sensing unit 12 and the spraying unit 13 in the instant embodiment are movable respectively by the first robot manipulator 121 and the second robot manipulator 131, but the movements of the temperature sensing unit 12 and the spraying unit 13 are not limited. For example, the first robot manipulator 121 and the second robot manipulator 131 can be formed as a single robot manipulator, and the temperature sensor 122 and the spraying gun 132 are installed on the single robot manipulator.

Figure 3:
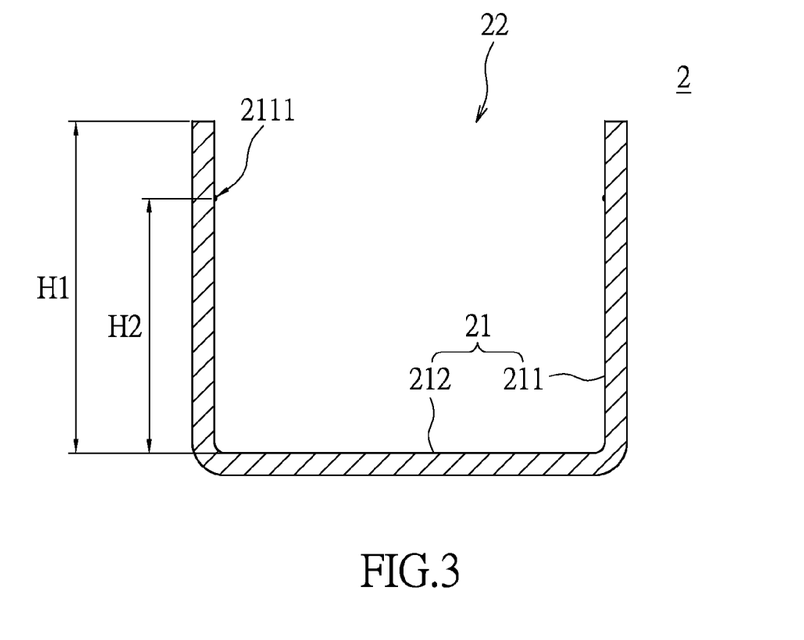
FIG. 3 is a cross-sectional view showing the crucible before spraying the slurry.

Step S102: a crucible 2 is disposed at a predetermined position. The inner wall 21 of the crucible 2 has a side surface 211 and a bottom surface 212 connected to one end of the side surface 211 (i.e., the bottom end of the side surface 211 as shown in FIG. 3). Another end of the side surface 211 (i.e., the top end of the side surface 211 as shown in FIG. 3) defines an opening 22. The side surface 211 defines at least one temperature sensing point 2111 by the computer 111, thereby providing the temperature sensing unit 12 to get a temperature of the temperature sensing point 2111 of the crucible 2 before spraying or after spraying.

Moreover, the crucible 2 is configured to receive a molten silicon (not shown) of a predetermined volume, the temperature sensing point 2111 is approximately arranged on a position of the side surface 211 corresponding to a level of the molten silicon received in the crucible 2. That is to say, a position of the side surface 211 corresponding to a highest level of the molten silicon received in the crucible 2 can define the temperature sensing point 2111. A distance H2 between the bottom surface 212 and the temperature sensing point 2111 is greater than 80% of a distance H1 between the opening 22 of the side surface 211 and the bottom surface 212.

Additionally, the profile of the crucible 2 in the instant embodiment is square for example, and the crucible 2 is often prepared with a length of 878 mm, a width of 878 mm, and a height of 540 mm; or the crucible 2 can be prepared with a length of 1040 mm, a width of 1040 mm, and a height of 540 mm. But, the crucible 2 and the ingots type (polycrystalline-ingot or monocrystalline-ingot) prepared by the crucible 2 are not limited to the instant embodiment. Moreover, the crucible 2 in the instant embodiment defines a plurality of temperature sensing points 2111 for example, but is not limited thereto. For example, the crucible 2 may define a ring-like temperature sensing line.

The implementing process of the instant step S102 is further disclosed as follows: the crucible 2 is laid on a platform 3, and the crucible 2 is positioned at the predetermined position by a positioning mechanism 31 of the platform 3. Thus, the platform 3 can be used for carrying different crucibles 2 by adjusting the positioning mechanism 31, that is to say, the crucibles 2 having different size or shape can be positioned at the predetermined position by the positioning mechanism 31. The above positioning manner corresponding to the crucible 2 is disclosed for example, but is not limited thereto.

Step S103: the crucible 2 is heated, and the temperature sensing unit 12 measures the inner wall 21 of the heated crucible 2 to get a first temperature. Specifically, after the crucible 2 is heated to a predetermined temperature, the computer 111 drives the first robot manipulator 121 to move the temperature sensor 122 toward the temperature sensing point 2111 of the crucible 2, and the temperature sensor 122 senses a temperature of the crucible 2 for obtaining the first temperature and to transmit the first temperature to the computer 111. After that, the first robot manipulator 121 moves away from the crucible 2.

Figure 4:
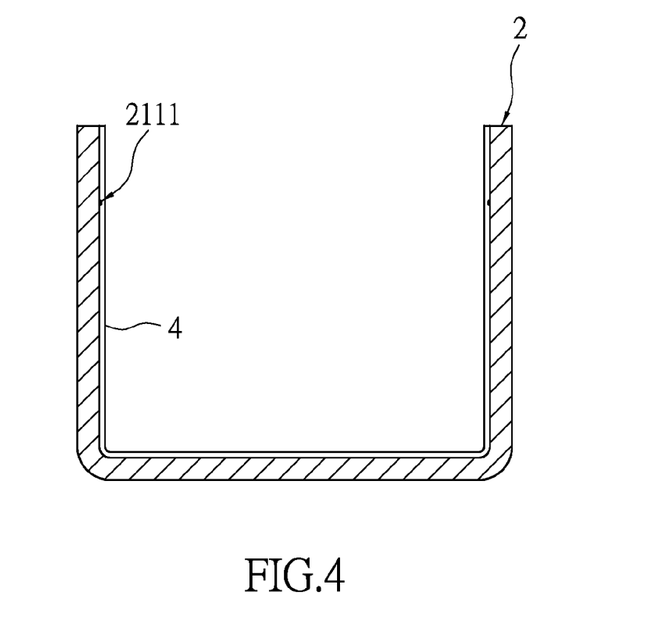
FIG. 4 is a cross-sectional view showing the crucible after spraying the slurry.

Step S104: the spraying unit 13 sprays a slurry onto the inner wall 21 of the crucible 2 to form an isolating layer 4 via the predetermined spraying manner. Specifically, the computer 111 drives the second robot manipulator 131 to move the spraying gun 132 according to the predetermined path and speed of the predetermined spraying manner set by the computer 111, and the spraying gun 132 sprays the slurry onto the inner wall 21 of the crucible 2 according to the sprayed amount of the slurry in per unit time, the spraying force of the slurry, and the spraying distance of the slurry, which are set by the computer 111. After that, the second robot manipulator 131 moves away from the crucible 2.

In addition, the spraying gun 132 in the instant embodiment is movable by operating the second robot manipulator 131, but is not limited thereto. For example, the relative position of the crucible 2 and the spraying gun 132 can be changed by rotating or moving the platform 3, thereby the spraying gun 132 can spray the slurry onto the inner wall 21 of the crucible 2.

Step S105: the temperature sensing unit 12 measures the isolating layer 4 formed on the inner wall 21 of the crucible 2 to get a second temperature. Specifically, the computer 111 drives the first robot manipulator 121 to move the temperature sensor 122 toward the temperature sensing point 2111 of the crucible 2, and the temperature sensor 122 senses a temperature of the crucible 2 (such as a portion of the isolating layer 4 adjacent to the temperature sensing point 2111) for obtaining the second temperature and to transmit the second temperature to the computer 111. After that, the first robot manipulator 121 moves away from the crucible 2.

Step S106: the processing unit 11 calculates the first and second temperatures to obtain a difference value, and the processing unit 11 judges whether the difference value is in a predetermined difference scope or not. The temperature of the slurry is lower than the first temperature, so the second temperature is lower than the first temperature. When the parameters about spraying of the slurry are fixed, the property of the isolating layer 4 can be determined by the difference value.

Specifically, when the above parameters (e.g., the predetermined position of the platform 3, the path and speed of the spraying gun 132, the sprayed amount of the slurry in per unit time, the spraying force of the slurry, and the spraying distance of the slurry) are fixed, the difference value of each temperature sensing point 2111 can represent the thickness of the isolating layer 4 adhered on the corresponding temperature sensing point 2111. When the difference value is larger, the thickness of the corresponding isolating layer 4 is larger. Thus, when the difference value of each temperature sensing point 2111 is substantially the same, the thickness of each isolating layer 4 adhered on the corresponding temperature sensing point 2111 is substantially the same (i.e., each portion of the isolating layer 4 has identical thickness).

Figure 5:
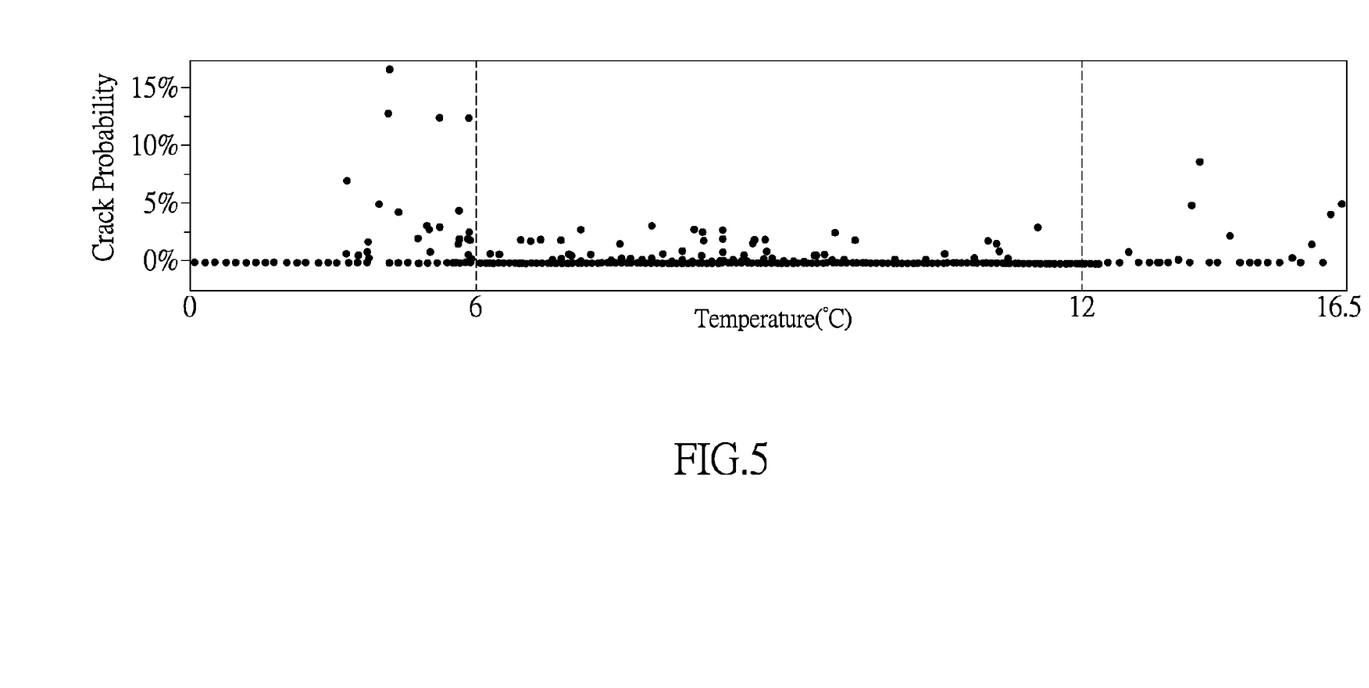
FIG. 5 is a chart showing the crack probability of ingots prepared by the crucible and the isolating layer, in which the difference value corresponding to the isolating layer is 0° C.~16.5° C.

Moreover, a result as shown in FIG. 5 is obtained by several experiments, and FIG. 5 shows the crack probability of ingots prepared by the crucible 2 and the isolating layer 4, in which the difference value corresponding to the isolating layer 4 is 0° C.~16.5° C. Please refer to FIG. 5, when the predetermined difference scope is about 6° C.~12° C., the isolating layer 4 has preferable uniformity and thickness, thereby preventing a crack from occurring on the ingots, which are prepared by the crucible 2 and the isolating layer 4 of the instant disclosure.

Figure 6:
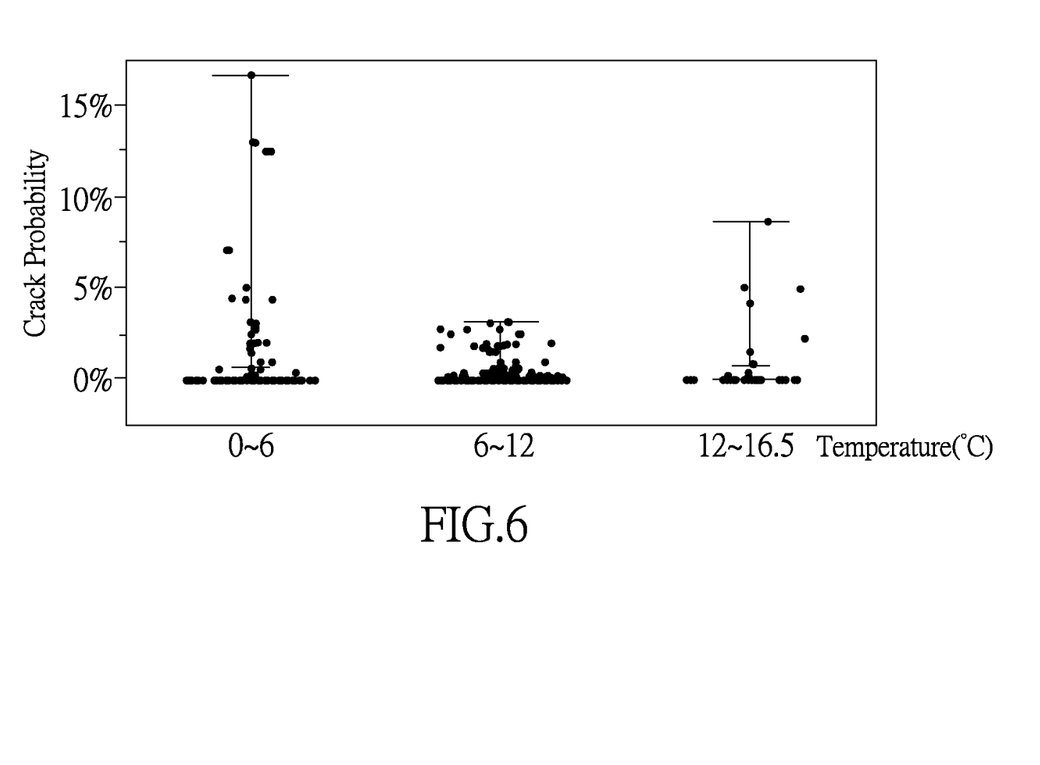
FIG. 6 is a chart integrating the data as shown in FIG. 5.

Furthermore, the data of FIG. 5 is integrated to form FIG. 6, and the following information can be got based on FIG. 6. When the difference value is 0° C.~6° C., the average crack probability of ingots, which are prepared by the crucible 2 and the isolating layer 4, is 0.8%. When the difference value is 6° C.~12° C., the average crack probability of ingots, which are prepared by the crucible 2 and the isolating layer 4, is 0.01%. When the difference value is 12° C.~16.5° C., the average crack probability of ingots, which are prepared by the crucible 2 and the isolating layer 4, is 0.08%. Accordingly, FIG. 6 presents that the average crack probability of ingots prepared by the crucible 2 and the isolating layer 4, in which the difference value corresponding to the isolating layer 4 is 6° C.~12° C., is lowest. In other words, the crack probability of ingots corresponding to the difference value being in the range 6° C.~12° C. is lower than the crack probability of ingots corresponding to the difference value being out of the range 6° C.~12° C.

Thus, the predetermined difference scope is first set as 6° C.~12° C. in the computer 111. When the difference value is in the predetermined difference scope, the thickness and the uniformity of the isolating layer 4 is acceptable, and then the spraying steps S104~S106 are implemented to the crucible 2 until a plurality of isolating layers 4 stacked on the inner wall 21 of the crucible 2 having a predetermined thickness (in the instant embodiment, when the crucible 2 is prepared with 10~14 layers of the isolating layers 4 stacked on the inner wall 21, the thickness of the 10~14 layers of the isolating layers 4 achieves the predetermined thickness); or the spraying steps S102~S106 are implemented to another crucible (not shown).

However, when the difference value is not in the predetermined difference scope, the thickness and the uniformity of the isolating layer 4 may have some faults, so the processing unit 11 transmits a signal to the spraying unit 13 for adjusting the predetermined spraying manner (e.g., the sprayed amount of the slurry in per unit time, the spraying force of the slurry, and the spraying distance of the slurry), thereby enabling amending the predetermined spraying manner immediately. For example, the predetermined spraying manner is checked to determine whether each adjustable parameter (e.g., the sprayed amount of the slurry in per unit time, the spraying force of the slurry, or the spraying distance of the slurry) is in the predetermined range or not. If the adjustable parameter is not in the predetermined range, the adjustable parameter should be adjusted according to the predetermined range. Specifically, when the difference value is lower than the predetermined difference scope, the amount of the slurry adhered on the inner wall 21 of the crucible 2 is too little, so the sprayed amount of the slurry in per unit time can be increased by the signal transmitted from the processing unit 11. When the difference value is greater than the predetermined difference scope, the amount of the slurry adhered on the inner wall 21 of the crucible 2 is too much, so the sprayed amount of the slurry in per unit time can be decreased by the signal transmitted from the processing unit 11.

Step S107: after a plurality of crucibles 2 are prepared with the isolating layers 4 by the spraying steps, the processing unit 11 is operated to get a standard deviation based on the difference values, which are in the predetermined difference scope, and then the standard deviation is compared to a predetermined standard deviation by the processing unit 11. That is to say, except for the amendment of the predetermined spraying manner in Step S106, when the spraying device 1 has been operated after a period of time, the spraying device 1 should be monitored to check whether it is in normal or abnormal mode.

Specifically, even if the difference values are in the predetermined difference scope when respectively forming the isolating layers 4 onto the crucibles 2, the difference values may fluctuate because the predetermined difference scope is a range. Moreover, after several experiments, the ingots prepared by the crucibles 2 and the isolating layers 4, in which the standard deviation corresponding to the isolating layers 4 is greater than 2° C., have a higher probability of a crack (e.g., higher than 54% of a crack occurring) than the ingots prepared by the crucibles 2 and the isolating layers 4, in which the standard deviation corresponding to the isolating layers 4 is smaller than or identical to 2° C. Thus, the standard deviation is first set as 2° C. in the computer 111. When the standard deviation is greater than the predetermined standard deviation, the spraying device 1 is in abnormal mode and needs to be detected; when the standard deviation is smaller than or identical to the predetermined standard deviation, the spraying device 1 is in normal mode for continuing operation.

In summary, the method and the spraying device of the instant disclosure are provided to get a difference value by measuring the temperature of the crucible before and after spraying the slurry, such that the processing unit can judge whether the predetermined spraying manner is operating in a normal or abnormal mode by comparing the difference value and the predetermined difference scope, thereby enabling to adjust the predetermined spraying manner immediately.

Moreover, after the spraying device is operated after a period of time, the processing unit is operated to get a standard deviation based on the difference values, which are in the predetermined difference scope, and then the standard deviation is compared to the predetermined standard deviation by the processing unit, thereby the spraying device can be monitored to check whether it is in normal or abnormal mode.

The descriptions illustrated supra set forth simply the preferred embodiments of the instant invention; however, the characteristics of the instant invention are by no means restricted thereto. All changes, alterations, or modifications conveniently considered by those skilled in the art are deemed to be encompassed within the scope of the instant invention delineated by the following claims.

What is claimed is:
1. A method for manufacturing an isolating layer onto a crucible, comprising:

a preparing step: providing a spraying device, wherein the spraying device has a processing unit, a temperature sensing unit electrically connected to the processing unit, and a spraying unit electrically connected to the processing unit; and a plurality of spraying steps, comprising:
   A) disposing a crucible at a predetermined position;
   B) heating the crucible, and then measuring an inner wall of the crucible to get a first temperature by the temperature sensing unit;
   C) spraying a slurry onto the inner wall of the crucible to form an isolating layer by the spraying unit via a predetermined spraying manner;
   D) measuring the isolating layer formed on the inner wall of the crucible to get a second temperature by the temperature sensing unit; and
   E) obtaining a difference value based on the first and second temperatures by the processing unit, and judging whether the difference value is in a predetermined difference scope or not by the processing unit, wherein the predetermined difference scope is 6° C.-12° C.; when the difference value is not in the predetermined difference scope, the processing unit transmits a signal to the spraying unit for adjusting the predetermined spraying manner; when the difference value is in the predetermined difference scope, the spraying steps C)-E) are implemented to the crucible until a plurality of isolating layers stacked on the inner wall of the crucible having a predetermined thickness, wherein the inner wall of the crucible has a side surface and a bottom surface connected to one end of the side surface, another end of the side surface defines an opening, and wherein the side surface defines at least one temperature sensing point, the first and second temperatures are gotten respectively by measuring the at least one temperature sensing point, wherein a distance between the bottom surface and the temperature sensing point is greater than 80% of a distance between the opening of the side surface and the bottom surface.

2. The method as claimed in claim 1, wherein the crucible is configured to receive a molten silicon of a predetermined volume, the temperature sensing point is arranged at a position of the side surface corresponding to a level of the molten silicon received in the crucible.

3. The method as claimed in claim 1, wherein the predetermined spraying manner has a plurality of adjustable parameters corresponding to a sprayed amount of the slurry in per unit time, a spraying force of the slurry, and a spraying distance of the slurry.

4. The method as claimed in claim 3, wherein the second temperature is lower than the first temperature; when the difference value is lower than the predetermined difference scope, the sprayed amount of the slurry in per unit time is increased; when the difference value is greater than the predetermined difference scope, the sprayed amount of the slurry in per unit time is decreased.

5. The method as claimed in claim 3, wherein the sprayed amount of the slurry in per unit time is 25-60 ml/s, the spraying force of the slurry is 50-90 lb/in$^2$, and the spraying distance of the slurry is 15-45 cm.

6. The method as claimed in claim 1, wherein after a plurality of crucibles are prepared with the isolating layers by the spraying steps, the processing unit is operated to get a standard deviation based on the difference values within the predetermined difference scope, and then the standard deviation is compared to a predetermined standard deviation by the processing unit; wherein when the standard deviation is greater than the predetermined standard deviation, the spraying device is in abnormal mode; when the standard deviation is smaller than or identical to the predetermined standard deviation, the spraying device is in normal mode.

7. The method as claimed in claim 6, wherein the predetermined standard deviation is 2° C.

\* \* \* \* \*